(12) United States Patent
Senz et al.

(10) Patent No.: US 9,923,015 B2
(45) Date of Patent: Mar. 20, 2018

(54) INFRARED PHOTOSENSOR

(71) Applicant: Robert Bosch GmbH, Stuttgart (DE)

(72) Inventors: Volkmar Senz, Metzingen (DE); Michael Krueger, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/031,929

(22) Filed: Sep. 19, 2013

(65) Prior Publication Data
US 2014/0091423 A1  Apr. 3, 2014

(30) Foreign Application Priority Data
Sep. 19, 2012 (DE) .................. 10 2012 216 814

(51) Int. Cl.
| | |
|---|---|
| *H01L 31/062* | (2012.01) |
| *H01L 31/113* | (2006.01) |
| *H01L 27/146* | (2006.01) |
| *H01L 31/102* | (2006.01) |
| *H01L 31/00* | (2006.01) |
| *H01L 31/0352* | (2006.01) |
| *H01L 31/103* | (2006.01) |

(52) U.S. Cl.
CPC .. *H01L 27/14649* (2013.01); *H01L 27/14601* (2013.01); *H01L 27/14603* (2013.01); *H01L 27/14643* (2013.01); *H01L 31/00* (2013.01); *H01L 31/0352* (2013.01); *H01L 31/102* (2013.01); *H01L 31/103* (2013.01)

(58) Field of Classification Search
CPC ......... H01L 27/14649; H01L 27/14603; H01L 27/14643; H01L 31/103; H01L 31/00; H01L 31/0352; H01L 27/14601; H01L 31/102
USPC ....... 257/292, 461, 290, 291, 431, 436, 458, 257/653
See application file for complete search history.

(56) References Cited

U.S. PATENT DOCUMENTS

| | | | | |
|---|---|---|---|---|
| 5,410,168 | A * | 4/1995 | Hisa ............................... | 257/324 |
| 5,994,162 | A * | 11/1999 | Burghartz ............... | H01L 31/18 257/E31.069 |
| 7,262,402 | B2 * | 8/2007 | Niclass et al. ............. | 250/214.1 |
| 7,288,825 | B2 * | 10/2007 | Rafferty et al. .............. | 257/436 |
| 8,253,215 | B2 * | 8/2012 | Yao ............................... | 257/461 |
| 8,836,833 | B2 * | 9/2014 | Yamashita et al. ........... | 348/301 |
| 2003/0121468 | A1 * | 7/2003 | Boone ..................... | C30B 23/02 117/78 |
| 2006/0237815 | A1 * | 10/2006 | Kim .................... | H01L 27/0629 257/500 |
| 2008/0217666 | A1 * | 9/2008 | Kao .................... | H01L 27/1463 257/290 |

(Continued)

*Primary Examiner* — Shouxiang Hu
(74) *Attorney, Agent, or Firm* — Norton Rose Fulbright US LLP; Gerard Messina

(57) ABSTRACT

A thermal diode for a photosensor of a thermal imaging camera includes a semiconductor substrate having a surface and two doped structures set apart from each other on the surface. Furthermore, a device is provided for influencing a current between the first and the second structure, in order to reduce a current density in an area near to the surface and to increase it in an area far from the surface. In addition, a topology having an even absorption layer is proposed. The measures proposed have the aim of realizing a low-noise diode for thermal applications.

12 Claims, 3 Drawing Sheets

(56) References Cited

U.S. PATENT DOCUMENTS

2010/0301442 A1* 12/2010 Iwai ................ H01L 31/022416
                                                                             257/437

* cited by examiner

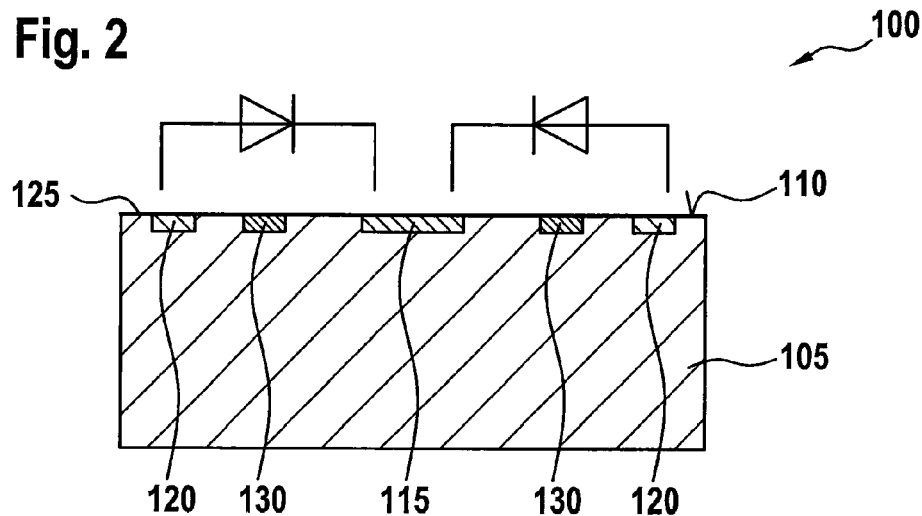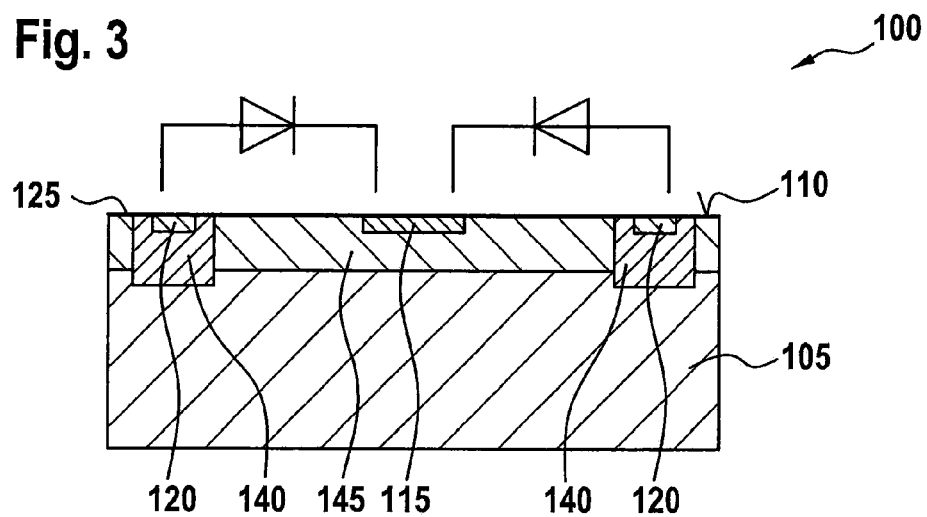

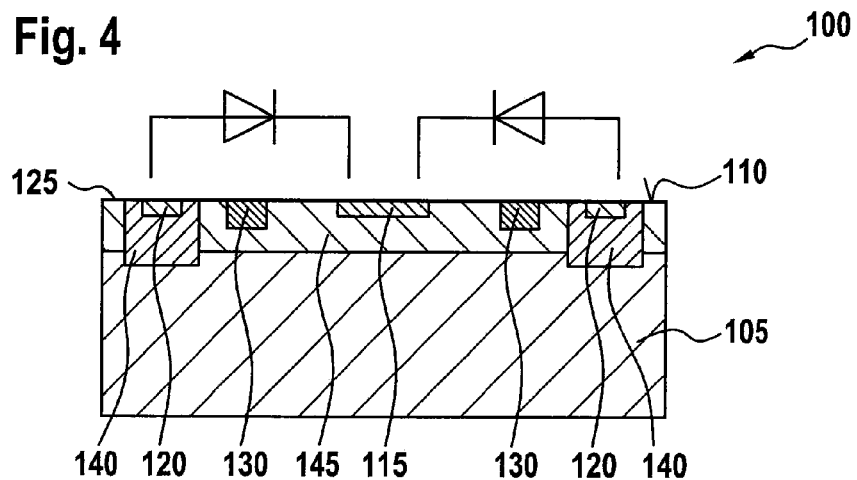
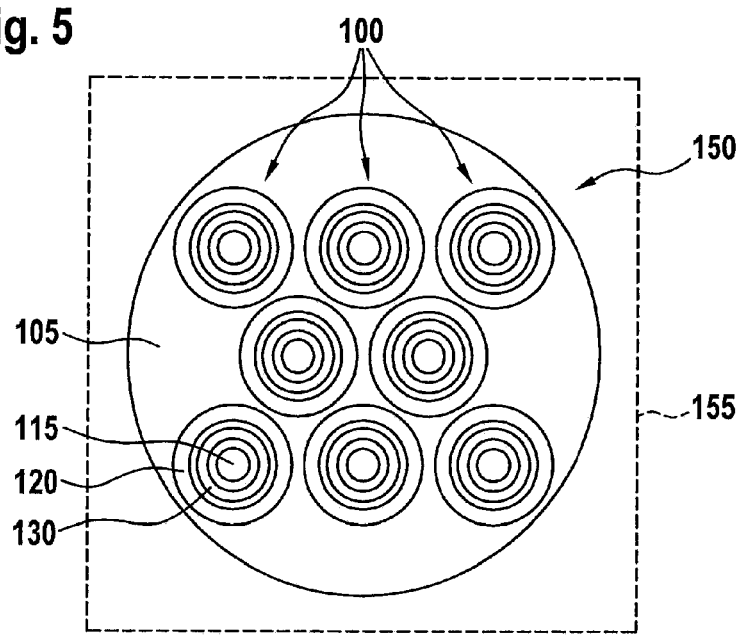

INFRARED PHOTOSENSOR

RELATED APPLICATION INFORMATION

The present application claims priority to and the benefit of German patent application no. 10 2012 216 814.1, which was filed in Germany on Sep. 19, 2012, the disclosure of which is incorporated herein by reference.

FIELD OF THE INVENTION

The present invention relates to a photosensor for a thermal imaging camera. In particular, the invention relates to a thermally sensitive diode for the photosensor.

BACKGROUND INFORMATION

A thermal imaging camera for spatially-resolved temperature measurement uses a thermally sensitive sensor array, in which a characteristic thermal radiation of an object is imaged onto an array of thermally sensitive sensor elements by a lens transmitting infrared radiation. For example, long-wave infrared radiation (LWIR) includes wavelengths in the range of approximately 8 to 14 μm. Due to the infrared radiation, the sensor elements warm up by amounts on the order of a few mK. An uncooled sensor array for characteristic thermal radiation may be realized cost-effectively on the basis of thermally sensitive diodes of silicon p-n junctions. The heating of the sensor element caused by the infrared radiation leads to a change in the current-voltage characteristic of a sensor element, which is able to be evaluated by electronics that are as low-noise as possible.

For the practical applicability of such a sensor element, it is necessary to honor further boundary conditions. In order to minimize an unwanted heat transfer from the sensor element, for example, the sensor element may be exposed micromechanically. In this manner, heating of the sensor element may be increased, and therefore the signal may be increased, so that a high signal-to-noise ratio may be attained. The thermal resolution of the sensor may thereby be improved. Furthermore, the individual sensor elements must have a greater extension than the wavelength used of approximately 8 μm; surface areas of approximately 12 μm$^2$ are customary. In addition, each sensor element should have its own absorption layer in order to ensure the best possible absorption of the infrared radiation to be received. For example, silicon dioxide may be used for that purpose. In addition, the aim should be for sufficient mechanical stability of the sensor element with respect to vibrations. The observance of these boundary conditions is essential in constructing a low-noise sensor element for the photosensor of a thermal imaging camera, so that customary methods for improving a signal-to-noise ratio of the sensor element may not be usable.

An object of the present invention is to indicate a thermal diode for a photosensor of a thermal imaging camera, the thermal diode exhibiting the lowest noise possible. A further object of the invention is to indicate a corresponding photosensor. The invention achieves these objectives by a thermal diode and a photosensor having the features set forth in the description herein. The further descriptions herein describe more specific embodiments.

SUMMARY OF THE INVENTION

A thermal diode according to the present invention for a photosensor of a thermal imaging camera includes a semiconductor substrate having a surface and two doped structures set apart from each other on the surface.

Furthermore, a device is provided for influencing a current between the first and the second structure, in order to reduce a current density in an area near to the surface and to increase it in an area far from the surface.

In order to perform a measurement, the thermal diode may be traversed by an external current, or an external voltage may be applied. Arriving infrared radiation alters the voltage-current characteristic (U/I characteristic), so that the radiation may be inferred on the basis of the change.

The noise of the thermal diode usually includes thermal noise, shot noise and 1/f noise. The 1/f noise of the thermal diode is produced in particular by structure defects within the semiconductor material or at an interface of the semiconductor material of the thermal diode. Such defects (traps) may trap charge carriers; the dwell time of trapped charge carriers may be highly variable. The entrance of a charge carrier into and its exit from such a defect alters the current flowing through the thermal diode and thus produces a current noise. Due to a great number of defects with different states, the spectra of the influences of all defects add up to a total spectrum that exhibits a 1/f characteristic. The amplitude of the 1/f noise decreases as the frequency rises, the noise-power density usually being cut in half upon doubling of the frequency.

Since the defects described occur especially in the area of the surface of a semiconductor substrate, the 1/f noise in particular may be reduced by directing the current flowing through the thermal diode, away from the surface into deeper layers of the semiconductor substrate. The signal-to-noise ratio of the thermal diode may thereby be improved, which means an amplified thermal resolution of the thermal diode or of a photosensor having a plurality of such thermal diodes may be achieved.

In a first variant, the device also includes a third doped structure disposed between the first and the second doped structure on the surface. The third doped structure need not be connected to a further electric potential, and in particular, need not lead to an electrical contacting which may be connected to an electrical or electronic element outside of the thermal diode. Such a structure is also referred to as potential-free or floating. The third doped structure forms a p-n junction with the surrounding semiconductor substrate, so that an electric field is formed in the area of the p-n junction. This field may cause a current flowing through the semiconductor substrate to be reduced in this area. The current flow between the first and the second doped structure may thereby be deviated into a deeper layer of the semiconductor substrate.

In one specific embodiment, the third structure extends at least 100 nm below the surface of the semiconductor substrate. The current may thereby be diverted sufficiently into deeper layers of the semiconductor substrate.

The thermal diode may be circular, the second structure surrounding the first structure at a constant distance. In this context, the third structure may be disposed concentrically between the first two structures, so that the second and third structures surround the first structure concentrically. Due to the circular formation of the thermal diode, the surface of the semiconductor substrate may be better utilized. At the same time, the circular third structure is able to assist efficiently in diverting the current between the first and second structures into deeper semiconductor layers.

In another variant, which may be combined with the aforesaid variant, the device includes a doped base below the first or the second structure, the doping extending at least 1

μm below the surface of the semiconductor substrate. While customary doped structures on the surface of the semiconductor substrate have a thickness of several 10 nm to a maximum of 100 nm, by forming a depth structure of 1 μm and more, the current flow in deeper layers of the semiconductor substrate may be promoted. In so doing, the diode current may be distributed onto an enlarged cross-sectional area between the base and the semiconductor substrate. A portion of the current which flows in a layer of the semiconductor substrate near to the surface may thereby be reduced to the advantage of a current flowing in deeper layers. In one specific embodiment, the base may also extend to a greater depth, e.g., approximately 3 to 5 μm.

In a first specific embodiment, the base is formed in one piece with the first or second structure. In other words, the first or second doped structure extends to the indicated depth in the semiconductor substrate.

In another specific embodiment, the base may be doped differently from the first or second structure. This allows the use of a doped semiconductor substrate or a layer of a doped semiconductor substrate on the undoped semiconductor substrate. In addition, the base may be manufacturable separately from the first or second doped structure, which means a manufacturing process is able to be made easier.

An absorption layer may be provided to cover the structures and the area situated between them on the surface of the semiconductor substrate, the absorption layer having a thickness modulated subject to the process, especially a uniform thickness. For example, the absorption layer may include silicon dioxide in order to improve absorption of the infrared radiation to be detected. By forming the absorption layer in a uniform thickness, the density of defects at the interface between the absorption layer and an adjacent layer may be reduced. In addition, different current paths are able to have more uniform lengths, that is, variance in the lengths of all current paths may be reduced. The 1/f noise is thereby able to be reduced overall.

In one specific embodiment, one surface of the absorption layer may be even. Furthermore, the thickness of the absorption layer may not exceed 50 nm. In one specific embodiment, the absorption layer may reach a layer thickness of no more than 20 nm. Due to a reduced layer thickness, a reduced impurity concentration may be obtained, which means the 1/f noise may therefore be reduced overall.

The thermal diode may be set up to provide a current-voltage characteristic, influenced by electromagnetic radiation in the infrared range, between the first and the second structure. In particular, the mid- or near-infrared range may be covered. In one specific embodiment, middle infrared radiation in a range of approximately 8 to 14 μm wavelength is utilized.

A photosensor according to the present invention for a thermal imaging camera, especially in the infrared range, includes at least one thermal diode of the type described above.

The invention will now be described in greater detail with reference to the attached figures.

BRIEF DESCRIPTION OF THE FIGURES

FIG. 2 shows a thermal diode with a field ring.
FIG. 3 shows a thermal diode with base.
FIG. 4 shows a thermal diode with base and a deep field ring.

FIG. 5 shows a photosensor having thermal diodes according to one of FIGS. 1A through 4.

DETAILED DESCRIPTION

Figure 1A:
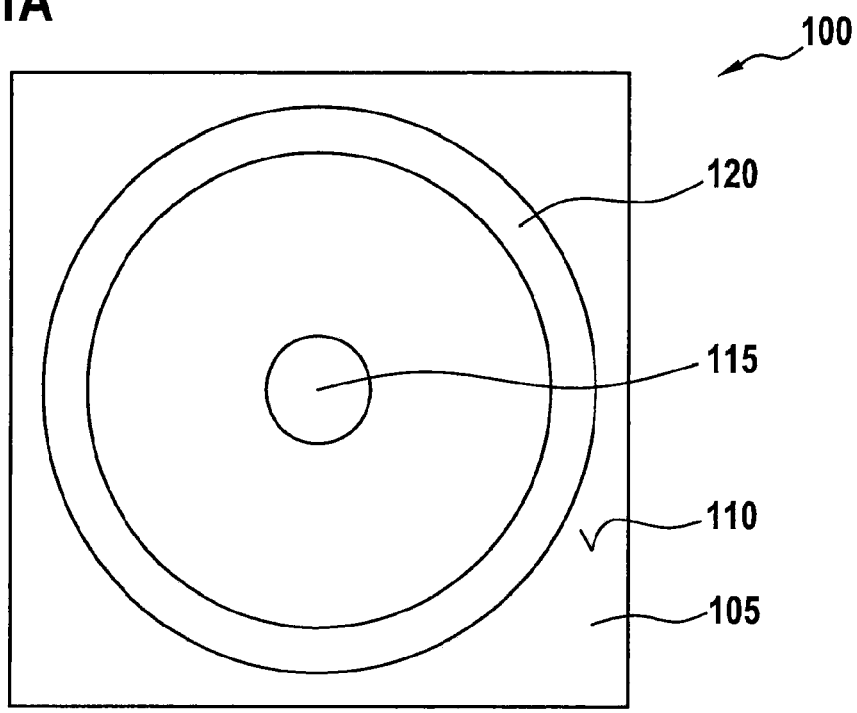
FIG. 1A shows a top view of the thermal diode.
Figure 1B:
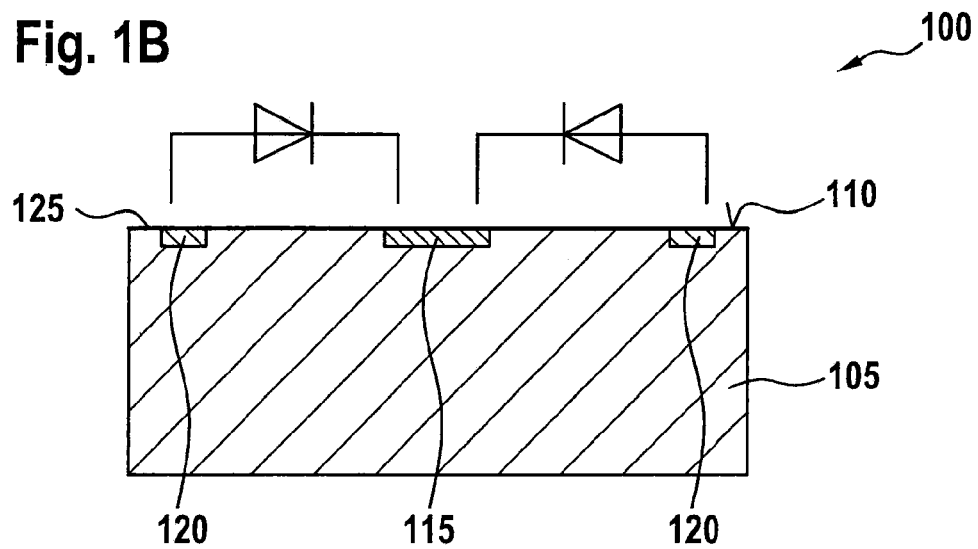
FIG. 1B shows a lateral view of the thermal diode.

FIG. 1A shows a top view and FIG. 1B shows a lateral view of thermal diode 100. In the specific embodiment shown, a concentric, especially a circular concentric formation is selected. In other specific embodiments, other concentric or linear formations may also be used.

A substrate 105 of semiconductor material, e.g., silicon (Si), has a surface 110 on which a first doped structure 115 and a second doped structure 120 are disposed. In this context, structures 115 and 120 on surface 110 may be embedded into substrate 105, as illustrated in FIG. 1B. Structures 115 and 120 as well as the area of surface 110 of substrate 105 may be situated between them are covered uppermost with an absorption layer 125. For example, absorption layer 125 may be formed of silicon dioxide ($SiO_2$).

Structures 115 and 120 are doped with different polarity; for instance, first structure 115 may be N-doped, while second structure 120 is P-doped. A reversed polarity is likewise possible. A diode is thereby obtained between structures 115 and 120. In the concentric type of construction shown, the diode is formed between outer structure 120 and inner structure 115, which is why, for reasons of symmetry, two diodes are drawn in symbolically in FIG. 1B. Functionally, however, there is only one diode.

If electromagnetic radiation, especially in the infrared range, falls on the configuration, a change in the U/I characteristic between structures 115 and 120 is thereby brought about. At a given current, the change in voltage is a function of the intensity of the electromagnetic radiation, so that the radiation may be determined on the basis of the change in voltage. The change in voltage is usually amplified by a suitable measuring amplifier, which is connected to areas 115 and 120, and evaluated. A photosensor for a thermal imaging camera may be formed by a plurality of thermal diodes 100 situated side-by-side.

To reduce a 1/f noise of thermal diode 100, absorption layer 125 is formed as thinly as possible. In one specific embodiment, the thickness of absorption layer 125 may be no more than approximately 50 nm, or, approximately 20 nm thick. Furthermore, it may be the case that the upper surface of absorption layer 125 be even. In this context, absorption layer 125 may have a uniform thickness. Owing to the formation of absorption layer 125 described, it is possible to reduce the defect density in the area of the interfaces between absorption layer 125 and adjacent layers 105, 115 and 120.

FIG. 2 shows a thermal diode 100 in a further specific embodiment. In accordance with the representation in FIG. 1B, a thermal diode 100 is shown which additionally has a potential-free third structure 130 that is disposed between first structure 115 and second structure 120. In the concentric specific embodiment depicted, third structure 130, like second structure 120, surrounds first structure 115, so that third doped structure 130 may be referred to as a field ring. Like first structure 115 and second structure 120, third structure 130 is formed by a doped semiconductor material, in one manner, the doping of outer second structure 120 may be adopted. However, a different doping may also be used.

In contrast to structures 115 and 120, third structure 130 is not set up to be connected to a further electrical or electronic element. In particular, no metal or other contacting surface is provided for the connection of third structure 130. Between third doped structure 130 and the surrounding material, here substrate 105, a p-n junction forms at which, upon the flow of current between structures 115 and 120, an electric field may be established which impedes a flow of current close to third structure 130. Density of the current flowing close to surface 110 of substrate 105 is thereby reduced, while the current density in deeper layers of substrate 105 is increased. A lower number of defect locations may be expected in the deeper layers, which is why the 1/f noise of thermal diode 100 may be reduced by diverting the current into deeper layers of substrate 105.

FIG. 3 shows a thermal diode 100 in a further specific embodiment. Corresponding to the representation in FIGS. 1B and 2, a variant is shown in which a base 140 is disposed below second doped structure 120. In another specific embodiment, base 140 may also be disposed below first doped structure 115.

Base 140 continues second doped structure 120 downward in the direction of deeper layers of substrate 105. In one specific embodiment, base 140 may be formed in one piece with second structure 120. Expressed differently, second doped structure 120 may reach into greater depths of substrate 105. In one specific embodiment, this depth is 100 to several 100 nm great and may reach 1 µm or more below surface 110.

In the specific embodiment shown, base 140 is produced from a semiconductor material which is doped differently than second structure 120. In addition, base 140 is embedded into a doped substrate 145 which forms the upper section of substrate 105. In the exemplary embodiment shown, first structure 115 is N+-doped, second structure 120 is P+, base 140 is P-well and doped substrate 145 is N-well. Other specific embodiments, particularly with polarity inverted at all elements, are likewise possible. Owing to base 140, a surface is enlarged, at which contact exists to surrounding substrate 105 or doped substrate 145. The diode current between first structure 115 and second structure 120 may thereby be distributed onto a larger cross-sectional area, whereby the current density may be reduced absolutely. All in all, due to the configuration shown, a greater portion of the diode current is able to flow in deeper layers of substrate 105 or of doped substrate 145, where fewer defects are able to impede the current flow.

FIG. 4 shows a thermal diode 100 in yet another specific embodiment based on the specific embodiment illustrated in FIG. 2, base 140 and doped substrate 145 of the specific embodiment shown in FIG. 3 likewise being depicted without restricting the generality. The features of the various specific embodiments put forth within the scope of this invention may be combined with each other in any way desired in order to provide a thermal diode 100 which is as low-noise as possible.

In the specific embodiment shown, third doped structure 130 is particularly deep, which may be 100 to several 100 nm. In one specific embodiment, the third structure may reach a thickness of 1 µm or even more. The effect of the diversion of the diode current into deeper areas of substrate 105 or of doped substrate 145 may be further promoted by the especially deep formation of third structure 130 shown. In combination with base 140 shown, this diversion is able to succeed particularly efficiently, so that thermal diode 100 may have an especially small 1/f noise component, and therefore a reduced noise.

FIG. 5 shows a photosensor 150 having thermal diodes 100. Thermal diodes 100 may be implemented to be concentric and round in the manner described above. In the specific embodiment shown, each thermal diode 100 includes a field ring in the form of third doped structure 130; however, another of the specific embodiments described or a combination of the specific embodiments described may also be used. Thermal diodes 100 are disposed on one common substrate 105; thermal diodes 100 may also be freed (exposed) micromechanically—individually or in groups—from substrate 105.

The edge length of thermal diodes 100, which are assigned to a picture element (pixel) of photosensor 150, may be at least as great as the wavelength of the infrared light to be detected. In the mid-infrared range (MWIR), the edge length may amount to approximately 3-5 µm, and in the long-wave infrared range (LWIR), to approximately 8-14 µm. In this context, one or more thermal diodes 100 may be assigned to one picture element.

Photosensor 150 may be used for the imaging of electromagnetic radiation, particularly infrared radiation. With the aid of photosensor 150 and by adding only a few further components, a thermal imaging camera 155 may be made available in an easy manner.

What is claimed is:

1. A thermal diode for a photosensor of a thermal imaging camera, comprising:
   a semiconductor substrate having a surface;
   a first doped structure embedded in the substrate at the surface, the first doped structure being doped with a dopant having a first conductivity type and at a respective dopant concentration;
   a second doped structure embedded in the substrate at the surface, the second doped structure being doped with a dopant having a second conductivity type and at a respective dopant concentration;
   the first doped structure and the second doped structure being set apart from each other on the surface; and
   a device to influence a current between the first doped structure and the second doped structure so that a current density is reduced in an area near to the surface and is increased in an area far from the surface, wherein:
   the device includes a base below one of the first doped structure and the second doped structure;
   the second doped structure surrounds the first doped structure at a constant distance;
   the base is doped to become a well region with a respective dopant at a respective doping concentration that is different than at least one of the respective dopant concentrations of the respective dopants of the first doped structure and the second doped structure in the first and second doped structures, respectively;
   the semiconductor substrate includes a first substrate region and an undoped second substrate region below the first substrate region;
   the first substrate region is a doped substrate region that is located at the surface and that is doped to the first conductivity type;
   the first doped structure is directly embedded in the first substrate region;
   the second doped structure is directly embedded in the base;
   the base is embedded partially in the first substrate region and partially in the second substrate region;
   the base is doped to the same conductivity type as that of the one of the first and second doped structures;
   the device includes a third doped structure embedded in the first substrate region; and the third doped structure is disposed between the first doped structure and the second doped structure on the surface.

2. The thermal diode of claim 1, wherein the third doped structure extends at least 100 nm below the surface of the semiconductor substrate.

3. The thermal diode of claim 1, wherein the second doped structure and the third doped structure surround the first doped structure concentrically.

4. The thermal diode of claim 3, wherein the base is formed in one piece with one of the first doped structure and the second doped structure.

5. The thermal diode of claim 1, wherein the doped base extends at least 1 µm below the surface of the semiconductor substrate.

6. The thermal diode of claim 1, further comprising:
an absorption layer for covering the structures and an area of the surface of the semiconductor substrate situated between them, the absorption layer having a uniform thickness.

7. The thermal diode of claim 6, wherein one surface of the absorption layer is even.

8. The thermal diode of claim 6, wherein a thickness of the absorption layer does not exceed 50 nm.

9. The thermal diode of claim 1, wherein the thermal diode is set up to provide a current-voltage characteristic, influenced by electromagnetic radiation in the infrared range, between the first doped structure and the second doped structure.

10. The thermal diode of claim 1, wherein the diode is circular.

11. A photosensor for a thermal imaging camera, comprising:
at least one thermal diode for a photosensor of a thermal imaging camera, including:
a semiconductor substrate having a surface;
a first doped structure embedded in the substrate at the surface, the first doped structure being doped with a dopant having a first conductivity type and at a respective dopant concentration;
a second doped structure embedded in the substrate at the surface, the second doped structure being doped with a dopant having a second conductivity type and at a respective dopant concentration;
the first doped structure and the second doped structure being set apart from each other on the surface; and
a device to influence a current between the first doped structure and the second doped structure so that a current density is reduced in an area near to the surface and is increased in an area far from the surface, wherein:
the device includes a base below one of the first doped structure and the second doped structure;
the second doped structure surrounds the first doped structure at a constant distance;
the base is doped to become a well region with a respective dopant at a respective doping concentration that is different than at least one of the respective dopant concentrations of the respective dopants of the first doped structure and the second doped structure in the first and second doped structures, respectively;
the semiconductor substrate includes a first substrate region and an undoped second substrate region below the first substrate region;
the first substrate region is a doped substrate region that is located at the surface and that is doped to the first conductivity type;
the first doped structure is embedded in the first substrate region;
the second doped structure is embedded in the base;
the base is embedded partially in the first substrate region and partially in the second substrate region;
the base is doped to the same conductivity type as that of the one of the first and second doped structures;
the device includes a third doped structure embedded in the first substrate region; and
the third doped structure is disposed between the first doped structure and the second doped structure on the surface.

12. The photosensor of claim 11, wherein the diode is circular.

* * * * *